(12) United States Patent
Yoshizaki et al.

(10) Patent No.: US 10,138,396 B2
(45) Date of Patent: Nov. 27, 2018

(54) POLISHING COMPOSITION

(71) Applicant: FUJIMI INCORPORATED, Kiyosu-shi, Aichi (JP)

(72) Inventors: Yukinobu Yoshizaki, Aichi (JP); Shogo Onishi, Kiyosu (JP)

(73) Assignee: FUJIMI INCORPORATED (JP)

( * ) Notice: Subject to any disclaimer, the term of this patent is extended or adjusted under 35 U.S.C. 154(b) by 0 days.

(21) Appl. No.: 15/761,050

(22) PCT Filed: Sep. 28, 2016

(86) PCT No.: PCT/JP2016/078657
§ 371 (c)(1),
(2) Date: Mar. 16, 2018

(87) PCT Pub. No.: WO2017/057478
PCT Pub. Date: Apr. 6, 2017

(65) Prior Publication Data
US 2018/0258320 A1 Sep. 13, 2018

(30) Foreign Application Priority Data
Sep. 30, 2015 (JP) ................................. 2015-192425

(51) Int. Cl.
*C09G 1/02* (2006.01)
*H01L 21/321* (2006.01)
(52) U.S. Cl.
CPC ............ *C09G 1/02* (2013.01); *H01L 21/3212* (2013.01)
(58) Field of Classification Search
CPC ..................... C09G 1/02; H01L 21/3212
See application file for complete search history.

(56) References Cited

U.S. PATENT DOCUMENTS

| | | | |
|---|---|---|---|
| 5,759,917 | A | 6/1998 | Grover et al. |
| 6,689,692 | B1 | 2/2004 | Grover et al. |
| 9,318,346 | B2 * | 4/2016 | Kanamaru .......... H01L 21/3212 |
| 2002/0023389 | A1 | 2/2002 | Minamihaba et al. |
| 2004/0089634 | A1 | 5/2004 | Grover et al. |
| 2004/0261323 | A1 | 12/2004 | Minamihaba |
| 2005/0274080 | A1 * | 12/2005 | Yoshida ................ C09G 1/02 51/308 |
| 2011/0163262 | A1 * | 7/2011 | Higuchi ................ C01B 33/14 252/79.1 |
| 2015/0079788 | A1 | 3/2015 | Guo |

FOREIGN PATENT DOCUMENTS

| | | |
|---|---|---|
| JP | 2001-507739 A | 6/2001 |
| JP | 2002-141314 A | 5/2002 |
| JP | 2005-011932 A | 1/2005 |
| JP | 2014-022511 A | 2/2014 |
| JP | 2015-063687 A | 4/2015 |
| WO | 2014/007063 A1 | 1/2014 |

OTHER PUBLICATIONS

Opposition filed against the corresponding Japanese patent No. 6140384 and partial English translation thereof, which includes partial English translations of WO2014/007063(A1) and WO2012/141111(A1).
International Search Report for International Application No. PCT/JP20161078657 dated Jan. 24, 2017.
Decision to Grant Patent for Japanese Patent Application No. 2017-513820 dated Apr. 6, 2017.
International Preliminary Report on Patentability for International Patent Application No. PCT/JP2016/078657 dated Apr. 12, 2018.

* cited by examiner

*Primary Examiner* — Duy Vu N Deo
(74) *Attorney, Agent, or Firm* — Katten Muchin Rosenman LLP

(57) ABSTRACT

The purpose of the present invention is to provide a polishing composition which can polish an object to be polished containing oxygen atoms and silicon atoms at high polishing speed, and can reduce generation of scratches on a surface of the object to be polished.
A polishing composition used for polishing an object to be polished containing oxygen atoms and silicon atoms, the polishing composition including: abrasive grains A having an average primary particle size of 3 nm or more and 8 nm or less; abrasive grains B having an average primary particle size of more than 8 nm; and a dispersing medium, wherein a content of the abrasive grains B in the polishing composition is larger than a content of the abrasive grains A in the polishing composition, average silanol group density of the abrasive grains A and the abrasive grains B is 2.0 $nm^{-2}$ or less, and an aspect ratio of the abrasive grains B is more than 1.3 and 2.0 or less.

7 Claims, No Drawings

POLISHING COMPOSITION

TECHNICAL FIELD

The present invention relates to a polishing composition.

BACKGROUND ART

In recent years, a so-called chemical mechanical polishing (CMP) technique for physically polishing and flattening a semiconductor substrate in producing a device has been used in accordance with multilayer wiring on a surface of a semiconductor substrate. CMP is a method for flattening the surface of an object to be polished like a semiconductor substrate by using a polishing composition (slurry) containing abrasive grains such as silica, alumina, or ceria, an anti-corrosion agent, a surfactant, or the like. The object to be polished is silicon, polysilicon, silicon oxide film, silicon nitride, a wiring or a plug which consists of metal, or the like.

As CMP slurry for polishing silicon oxide, for example, an aqueous chemical machine polishing composition containing salt, soluble cerium, carboxylic acid and fumed silica is disclosed in Patent Document 1. Further, Patent Document 2 discloses a chemical machine polishing composition containing water, 0.1% by weight to 40% by weight of colloidal silica abrasive grains and 0.001% by weight to 5% by weight of an additive (pyridine derivative).

CITATION LIST

Patent Literature

Patent Literature 1: JP 2001-507739 A
Patent Literature 2: JP 2015-063687 A

SUMMARY OF INVENTION

Technical Problem

However, there is a problem that, although the aqueous chemical machine polishing composition described in Patent Literature 1 can improve polishing speed of a silicon oxide substrate, many scratches are generated on a surface of the substrate.

Further, there is a problem that, although the chemical machine polishing composition described in Patent Literature 2 can suppress the generation of such scratches on the surface of the silicon oxide substrate, polishing speed is not sufficient.

As described above, regarding polishing an object to be polished containing oxygen atoms and silicon atoms, a polishing composition that can solve the problem which are improving the polishing speed and reducing the generation of scratches, which seem to conflict with each other, has been desired.

Accordingly, a purpose of the present invention is to provide a polishing composition which can polish an object to be polished containing oxygen atoms and silicon atoms at high polishing speed, and can reduce the generation of scratches on a surface of the object to be polished.

Solution to Problem

To solve the above problems, the inventors of the present invention have been conducted keen studies. As a result, they have found that the problems can be solved by a polishing composition which contains: abrasive grains A having a small particle size; and abrasive grains B having a particle size larger than that of the abrasive grains A, wherein a content of the abrasive grains B is larger than that of the abrasive grains A, average silanol group density of the abrasive grains A and the abrasive grains B is 2.0 $nm^{-2}$ or less, and an aspect ratio of the abrasive grains B is more than 1.3 and 2.0 or less. Then, the present invention has been completed based on the studies accordingly.

That is, the present invention is a polishing composition used for polishing an object to be polished containing oxygen atoms and silicon atoms, the polishing composition including: abrasive grains A having an average primary particle size of 3 nm or more and 8 nm or less; abrasive grains B having an average primary particle size of more than 8 nm; and a dispersing medium, wherein a content of the abrasive grains B in the polishing composition is larger than a content of the abrasive grains A in the polishing composition, average silanol group density of the abrasive grains A and the abrasive grains B is 2.0 $nm^{-2}$ or less, and an aspect ratio of the abrasive grains B is more than 1.3 and 2.0 or less.

Advantageous Effect of Invention

According to the present invention, a polishing composition which can polish the object to be polished containing oxygen atoms and silicon atoms at high polishing speed, and can reduce the generation of scratches on the surface of the object to be polished can be provided.

DESCRIPTION OF EMBODIMENTS

The present invention relates to a polishing composition used for polishing an object to be polished containing oxygen atoms and silicon atoms, the polishing composition including: abrasive grains A having an average primary particle size of 3 nm or more and 8 nm or less; abrasive grains B having an average primary particle size of more than 8 nm; and a dispersing medium, wherein a content of the abrasive grains B in the polishing composition is larger than a content of the abrasive grains A in the polishing composition, average silanol group density of the abrasive grains A and the abrasive grains B is 2.0 $nm^{-2}$ or less, and an aspect ratio of the abrasive grains B is more than 1.3 and 2.0 or less. The polishing composition of the present invention having such a structure can polish the object to be polished containing oxygen atoms and silicon atoms at high polishing speed, and can reduce the generation of scratches on a surface of the object to be polished.

A detailed reason why the above-described effects can be obtained when using the polishing composition of the present invention is not clear, but can be presumed as described below. Incidentally, the present invention is not limited to the following reason.

Since the abrasive grains A and the abrasive grains B of the present invention have low average silanol group density, zeta potential tends to be positive. On the other hand, zeta potential of the object to be polished containing oxygen atoms and silicon atoms is negative. Thus, the abrasive grains A and B and the object to be polished pull each other, whereby the polishing speed is increased.

Whereas, if the average silanol group density of the abrasive grains is low, true density is high, and hardness is also high. If using the abrasive grains having high hardness, generation of scratches on the surface of the object to be polished generally tends to be increased. Further, if an aspect ratio of the abrasive grains is high, due to their variant shapes, generation of scratches on the surface of the object to be polished generally tends to be increased as well.

However, as in the present invention, some mutual interaction can be obtained by the combination of: the required condition of the relation between the contents of the abrasive grains A and abrasive grains B; the required condition of the average silanol group density of the abrasive grains A and abrasive grains B; and the required condition of the aspect ratio of the abrasive grains B. Thereby, the purpose for: increasing the polishing speed of the object to be polished containing oxygen atoms and silicon atoms; and reducing the generation of scratches on the surface of the object to be polished, which seem to conflict with each other, can be surprisingly accomplished in an uncertain mechanism.

Hereinafter, detailed description of the present invention will be provided.

[Object to be Polished]

The object to be polished according to the present invention contains oxygen atoms and silicon atoms. Examples of the object to be polished include materials such as silicon oxide ($SiO_2$), tetraethylorthosilicate (TEOS) and the like. These materials may be used alone or in combination of two kinds or more. The effects of the polishing composition of the present invention are more likely to be exerted particularly in the case where the object to be polished contains tetraethylorthosilicate (TEOS). Accordingly, according to a preferable embodiment of the present invention, the object to be polished contains tetraethylorthosilicate.

The object to be polished according to the present invention may further contain other materials as long as it contains oxygen atoms and silicon atoms. Examples of the other materials include silicon nitride (SiN), silicon carbide (SiC), sapphire ($Al_2O_3$), silicon-germanium (SiGe) and the like.

Next, the structure of the polishing composition of the present invention will be described below in detail.

[Abrasive Grain]

As kinds of the abrasive grains A and the abrasive grains B used in the present invention, for example, metal oxide such as silica, alumina, zirconia and titania can be exemplified. Each of the abrasive grains A and the abrasive grains B may be one or plural kinds. Further, the kinds of the abrasive grains A and the abrasive grains B may be the same or different. Moreover, each of the abrasive grains A and the abrasive grains B may be either commercial product or synthetic product.

The kinds of the abrasive grains A and the abrasive grains B are preferably silica, and are more preferably colloidal silica. As a method for producing colloidal silica, a sodium silicate method and a sol-gel method can be exemplified, and colloidal silica produced by either method can be used preferably as the abrasive grains A and the abrasive grains B of the present invention. However, in the light of reducing metal impurities, colloidal silica produced by the sol-gel method, which can produce colloidal silica at high purity, is more preferable.

<Average Primary Particle Size>

The abrasive grains A used in the present invention have an average primary particle size of 3 nm or more and 8 nm or less. If the average primary particle size of the abrasive grains A is less than 3 nm, an effect of accelerating the polishing speed per one abrasive grain is extremely lowered, so that the acceleration effect of the polishing speed is also lowered.

A lower limit of the average primary particle size of the abrasive grains A is preferably 4.0 nm or more, is more preferably 5.0 nm or more, and is further preferably 6.0 nm or more. Further, an upper limit of the average primary particle size of the abrasive grains A is preferably less than 8.0 nm, is more preferably 7.5 nm or less, and is further preferably 6.5 nm or less.

Moreover, the abrasive grains B used in the present invention have an average primary particle size of more than 8 nm. If the average primary particle size of the abrasive grains is 8 nm or less, since polishing speed of one abrasive grain is lowered, the expected effect of accelerating the polishing speed cannot be generally obtained. On the other hand, by containing the abrasive grains A having the average primary particle size of 8 nm or less in the amount smaller than that of the abrasive grains B as in the present invention, the expected effect of the present invention can be exerted.

A lower limit of the average primary particle size of the abrasive grains B is preferably 15 nm or more, is more preferably 20 nm or more, is further preferably 25 nm or more, and is still further preferably 27 nm or more. Moreover, an upper limit of the average primary particle size of the abrasive grains B is not limited particularly, but is preferably 80 nm or less, is more preferably 40 nm or less, and is further preferably 35 nm or less.

Incidentally, the average primary particle sizes of the abrasive grains A and the abrasive grains B are respectively measured by an FE-SEM (field emission scanning electron microscope).

<Average Silanol Group Density>

The average silanol group density of the abrasive grains A and the abrasive grains B contained in the polishing composition of the present invention is 2.0 $nm^{-2}$ or less. If the average silanol group density is more than 2.0 $nm^{-2}$, hardness of the abrasive grains is low, and the polishing speed is accordingly lowered.

The average silanol group density of the abrasive grains A and the abrasive grains B is preferably 1.9 $nm^{-2}$ or less, is more preferably 1.8 $nm^{-2}$ or less, and is further preferably 1.7 $nm^{-2}$ or less. For obtaining the acceleration effect of the polishing speed maximumly, 1.6 $nm^{-2}$ or less is preferable, and 1.5 $nm^{-2}$ or less is more preferable.

For reducing the number of scratches, the average silanol group density of the abrasive grains A and the abrasive grains B is preferably 0.5 $nm^{-2}$ or more, is more preferably 0.7 $nm^{-2}$ or more, and is further preferably 1.2 $nm^{-2}$ or more.

Incidentally, a lower limit of the average silanol group density is generally 0.

The average silanol group density ($nm^{-2}$) of the abrasive grains A and the abrasive grains B is calculated by a Sears titration method using neutralization titration described in Analytical Chemistry, vol. 28, No. 12, 1956, 1982-1983 by G. W. Sears. The Sears titration method is an analytical method generally used for evaluating the number of silanol groups, in which the number of silanol groups can be calculated from an amount of sodium hydroxide aqueous solution required for pH value transition from 4 to 9.

More specifically, the average silanol group density of the abrasive grains A and the abrasive grains B can be obtained by conducting a titration using a mixture of the abrasive grains A and the abrasive grains B as a measurement sample based on the above-described method so as to calculate the average silanol group density by substituting the obtained value into a below formula. A value C in the below formula is a total mass (sum of masses) of the abrasive grains A and the abrasive grains B, a value S in the formula is a weighted average of respectively measured BET specific surface areas of the abrasive grains A and the abrasive grains B, considering a blend ratio of the abrasive grains A and the abrasive grains B. Incidentally, average silanol group density in the case where the abrasive grains are one kind can be calculated by substituting a mass of the abrasive grains for "C" and a BET specific surface area of the abrasive grains for "S".

More specifically, 1.50 g of abrasive grains as a solid content are collected and poured into a beaker of 200 ml, about 100 ml of pure water is added thereto so as to make slurry, and 30 g of sodium chloride is subsequently added and dissolved into the slurry. Next, 1N of hydrochloric acid is added so as to adjust a pH value of the slurry into about 3.0 to 3.5, and water is added thereto until an amount of the slurry reaches 150 ml. This slurry is adjusted to have a pH value of 4.0 at 25° C. by adding 0.1 N of sodium hydroxide solution using an automatic titrator (COM-1700, produced by Hiranuma Sangyo Co., Ltd.), and further, volume V [L] of 0.1 N of sodium hydroxide solution required for increasing the pH value from 4.0 to 9.0 in pH titration is measured. The average silanol group density (the number of silanol groups) can be obtained by the calculation based on the following formula.

$$\rho = (c \times V \times N_A \times 10^{-21})/(C \times S) \quad \text{[Mathematical Formula 1]}$$

In the above formula, $\rho$ represents the average silanol group density (the number of silanol groups) ($nm^{-2}$);

c represents the concentration (mol/L) of the sodium hydroxide solution used for the titration;

V represents the volume (L) of the sodium hydroxide solution required for increasing the pH value from 4.0 to 9.0;

$N_A$ represents Avogadro constant ($mol^{-1}$);

C represents the total mass (solid content) (g) of the abrasive grains A and the abrasive grains B; and S represents the weighted average ($nm^2/g$) of the BET specific surface areas of the abrasive grains A and the abrasive grains B.

Incidentally, in the case of using the "mixture of the abrasive grains A and the abrasive grains B" as the measurement sample, the respective BET specific surface areas of the abrasive grains A and the abrasive grains B can be measured by separating them by centrifugal separation and filtration.

The average silanol group density of the abrasive grains A alone is preferably 3.8 $nm^{-2}$ or more, and is more preferably 4.0 $nm^{-2}$ or more. Further, the average silanol group density of the abrasive grains A is preferably 5.1 $nm^{-2}$ or less, and is more preferably 4.9 $nm^{-2}$ or less.

The average silanol group density of the abrasive grains B alone is preferably 1.3 $nm^{-2}$ or more, and is more preferably 1.4 $nm^{-2}$ or more. Further, the average silanol group density of the abrasive grains B is preferably 1.8 $nm^{-2}$ or less, and is more preferably 1.7 $nm^{-2}$ or less.

Moreover, the abrasive grains A and the abrasive grains B may be surface-modified as long as their average silanol group density is within the above-described range. In particular, colloidal silica with organic acid immobilized thereto is preferable. Such immobilization of the organic acid to surfaces of the colloidal silica contained in the polishing composition is made by, for example, chemically bonding functional groups of the organic acid with the surfaces of the colloidal silica. The organic acid is not immobilized to the colloidal silica just by allowing the colloidal silica and the organic acid to coexist. If immobilizing sulfonic acid that is a kind of such organic acid to the colloidal silica, for example, a method described in "Sulfonic acid-functionalized silica through quantitative oxidation of thiol groups", Chem. Commun. 246-247 (2003) can be adopted. More specifically, by coupling a silane coupling agent having thiol groups such as 3-mercaptopropyltrimethoxysilane with the colloidal silica, and subsequently oxidizing the thiol groups with hydrogen peroxide, the colloidal silica with the sulfonic acid immobilized to its surface can be obtained. Alternatively, if immobilizing carboxylic acid to the colloidal silica, for example, a method described in "Novel Silane Coupling Agents Containing a Photolabile 2-Nitrobenzyl Ester for Introduction of a Carboxy Group on the Surface of Silica Gel", Chemistry Letters, 3, 228-229 (2000)" can be adopted. More specifically, by coupling a silane coupling agent containing photolabile 2-nitrobenzyl ester with the colloidal silica and subsequently irradiating the colloidal silica with light, the colloidal silica with carboxylic acid immobilized to its surface can be obtained.

Incidentally, the abrasive grains used in the present Working examples and Comparative Examples are not surface-modified.

<Aspect Ratio>

An aspect ratio (longer diameter/shorter diameter) of the abrasive grains B is more than 1.3 and 2.0 or less. If the aspect ratio is 1.3 or less, the polishing speed of the object to be polished is lowered. On the other hand, if the aspect ratio is more than 2.0, the number of scratches generated on the object to be polished is increased. The aspect ratio is preferably 1.40 or more, and is more preferably 1.45 or more. Further, the aspect ratio is preferably 1.9 or less, is more preferably 1.8 or less, is further preferably 1.7 or less, and is still further preferably 1.6 or less. Incidentally, as the aspect ratio of the abrasive grains B, an average value of aspect ratios of 300 particle images, which are extracted at random from particle images obtained by the FE-SEM, is adopted.

The aspect ratio (longer diameter/shorter diameter) of the abrasive grains A is not limited particularly, but preferably ranges from 1.3 to 3.0, preferably ranges from 1.5 to 2.5, preferably ranges from 1.6 to 2.0, and more preferably ranges from 1.7 to 1.9.

The average primary particle size of the abrasive grains A and the abrasive grains B, the average silanol group density of the abrasive grains A and the abrasive grains B and the aspect ratio of the abrasive grains B can be controlled by selecting a method for producing the abrasive grains or the like. More specifically, the silanol group density can be controlled by adjusting a temperature, a pH value and dropping speed during growth of the abrasive grains, and the aspect ratio can be controlled by adjusting the temperature and the pH value during the growth of the abrasive grains. Also, they may be controlled as necessary with reference to the disclosures in JP 2001-002411 A, JP 2000-178020 A, WO 2008/123373 A, JP H5-085716 A, JP H6-316407 A, U.S. Pat. No. 6,334,880, WO 2010/035613 A and the like alone or in combination.

<Content of Abrasive Grains and Content Ratio (Ratio Between Abrasive Brains A and B>

In the present invention, a content of the abrasive grains B in the polishing composition is larger than a content of the abrasive grains A in the polishing composition. If the content of the abrasive grains B is smaller than or equal to the content of the abrasive grains A in the polishing composition, a contact area of the abrasive grains with a surface to be polished is increased, but since a polishing amount of one abrasive grain A is significantly smaller than that of one abrasive grain B, the acceleration of the polishing speed becomes difficult.

A mass ratio between the abrasive grains A and the abrasive grains B (abrasive grains A/abrasive grains B) in the polishing composition preferably ranges from 0.01/ 99.99 to 20/80, and more preferably ranges from 0.01/99.99 to 15/85, further preferably ranges from 0.01/99.99 to 12/88, and still further preferably ranges from 0.01/99.99 to 8/92. Within these ranges, the effects of the present invention can be obtained more efficiently.

A lower limit of a total content (concentration) of the abrasive grains A and the abrasive grains B in the polishing composition is preferably 0.002% by mass or more, is more preferably 0.02% by mass or more, is further preferably 0.1% by mass or more, is still more preferably 0.5% by mass or more, is still further preferably 1.5% by mass or more, and is particularly preferably 2.0% by mass or more with respect to a total mass of the composition.

Further, an upper limit of the total content (concentration) of the abrasive grains A and the abrasive grains B in the polishing composition is preferably 10% by mass or less, is more preferably 8% by mass or less, is further preferably 6% by mass or less, and is still further preferably 5% by mass or less with respect to the total mass of the composition. In this range, high polishing speed can be obtained while suppressing a cost.

[Dispersing Medium]

The polishing composition of the present invention contains a dispersing medium for dispersing the respective components. As the dispersing medium, water is preferable. For suppressing inhabitation of the effects of the other components, the dispersing medium is preferably water that contains least possible impurities, more specifically, pure water, ultrapure water or distilled water, which is obtained by removing impurity ions with ion exchange resin and subsequently removing foreign substances by filtration.

[PH Value of Polishing Composition]

A pH value of the polishing composition of the present invention is not limited particularly, but in the light of the dispersion stability of the abrasive grains, a lower limit of the pH value is preferably 1.0 or more, and is more preferably 2.0 or more. Further, an upper limit of the pH value is preferably 7.0 or less, is more preferably 6.0 or less, is further preferably 5.0 or less, and is particularly preferably 4.0 or less. Thus, according to the preferable embodiment of the present invention, the pH value of the polishing composition of the present invention is 2.0 or more and 6.0 or less. According to this embodiment, desired processing speed can be obtained.

The pH value can be adjusted by adding an appropriate amount of a pH regulator. The pH regulator, which is used as necessary for adjusting the pH value of the polishing composition into a desired value, may be either acid or alkali, and may be either an inorganic compound or an organic compound. Specific examples of the acid include the inorganic acid such as sulfuric acid, nitric acid, boric acid, carbonic acid, hypophosphoric acid, phosphorous acid and phosphoric acid, and the organic acid including: carboxylic acid such as formic acid, acetic acid, propionic acid, butyric acid, valeric acid, 2-methylbutyric acid, n-hexanoic acid, 3,3-dimethyl butyrate, 2-ethyl butyrate, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid and lactic acid; organic sulfonic acid such as methanesulfonic acid, ethanesulfonic acid and isethionic acid; organic phosphoric acid such as phytic acid and hydroxyethylidene diphosphonic acid; and the like. Specific examples of the alkali include: hydroxide of alkali metal such as potassium hydroxide; amine such as ammonia, ethylenediamine and piperazine; and quaternary ammonium salts such as tetramethylammonium and tetraethylammonium. These pH regulators can be used alone or as a mixture of two kinds or more.

[Other Component]

The polishing composition of the present invention may further contain other components such as an oxidizing agent, metal anticorrosive, an antiseptic agent, an antifungal agent, water-soluble polymer and organic solvent for dissolving an insoluble organic matter, as necessary. Hereinafter, the oxidizing agent, the metal anticorrosive, the antiseptic agent and the antifungal agent, which are preferably added as the other components, will be described.

[Oxidizing Agent]

The oxidizing agent that can be added into the polishing composition has an effect for oxidizing the surface of the object to be polished so as to increase the polishing speed of the object to be polished by the polishing composition.

The usable oxidizing agents include hydrogen peroxide, sodium peroxide, barium peroxide, ozonated water, silver (II) salts, silver(III) salts, permanganic acid, chromic acid, dichromic acid, peroxodisulfuric acid, peroxophosphoric acid, peroxosulfuric acid, peroxyboric acid, performic acid, peracetic acid, perbenzoic acid, perphthalic acid, hypochlorous acid, hypobromous acid, hypoiodous acid, chloric acid, chlorous acid, perchloric acid, bromic acid, iodic acid, periodic acid, persulfuric acid, dichloroisocyanuric acid, their salts and the like. These oxidizing agents may be used alone or as a mixture of two kinds or more.

A content of the oxidizing agent in the polishing composition is preferably 0.1 g/L or more, is more preferably 1 g/L or more, and is further preferably 3 g/L or more. As the content of the oxidizing agent is larger, the polishing speed of the object to be polished by the polishing composition is higher.

Further, the content of the oxidizing agent in the polishing composition is preferably 200 g/L or less, is more preferably 100 g/L or less, and is further preferably 40 g/L or less. As the content of the oxidizing agent is smaller, a material cost of the polishing composition can be suppressed more, and a treatment of the polishing composition after being used for the polishment, that is, a load on a disposal of waste liquid can be reduced more. In addition, possibility that the surface of the object to be polished is excessively oxidized by the oxidizing agent can also be reduced.

[Metal Anticorrosive]

Addition of the metal anticorrosive into the polishing composition can suppress generation of a hollow on a side of a wiring during the polishment with the polishing composition. Further, the addition of the metal anticorrosive can also suppress generation of dishing on the surface of the object to be polished after the polishment with the polishing composition.

The usable metal anticorrosive is not limited particularly, but is preferably a heterocyclic compound or a surfactant. The number of heterocyclic rings in the heterocyclic compound is not limited particularly. Further, the heterocyclic compound may be a monocyclic compound or a polycyclic compound having a fused ring. The metal anticorrosive can be used alone or as a mixture of two kinds or more. Moreover, the metal anticorrosive may be a commercial product or a synthetic product.

Specific examples of the heterocyclic compound that can be used as the metal anticorrosive include nitrogen-containing heterocyclic compounds such as a pyrrolic compound, a pyrazole compound, an imidazole compound, a triazole compound, a tetrazole compound, a pyridine compound, a pyrazine compound, a pyridazine compound, a pyrindine compound, an indolizine compound, an indole compound, an isoindole compound, an indazole compound, a purine compound, a quinolizine compound, a quinoline compound, an isoquinoline compound, a naphthyridine compound, a phthalazine compound, a quinoxaline compound, a quinazoline compound, a cinnoline compound, a buterizine compound, a thiazole compound, an isothiazole compound, an oxazole compound, an soxazole compound and a furazan compound.

[Antiseptic Agent and Antifungal Agent]

Examples of the antiseptic agent and the antifungal agent used in the present invention include: isothiazolin-based antiseptic agents such as 2-methyl-4-isothiazolin-3-one and 5-chloro-2-methyl-4-isothiazolin-3-one; paraoxybenzoic acid esters; phenoxyethanol; and the like. These antiseptic agents and antifungal agents may be used alone or as a mixture of two kinds or more.

[Method for Manufacturing Polishing Composition]

A method for manufacturing the polishing composition of the present invention is not limited particularly, and the polishing composition can be obtained by stirring and mixing, for example, the abrasive grains and the other components as necessary in the dispersing medium.

A temperature during mixing the respective components is not limited particularly, but preferably ranges from 10° C. to 40° C., and they may be heated so as to enhance rates of dissolution. Also, mixing time is not limited particularly.

[Polishing Method and Method for Manufacturing Substrate]

As described above, the polishing composition of the present invention is preferably used for polishing an object to be polished containing oxygen atoms and silicon atoms. Thus, the present invention provides a method for polishing such an object to be polished containing oxygen atoms and silicon atoms with the polishing composition of the present invention.

A polishing device may be a general polishing device provided with: a holder for holding a substrate or the like which has an object to be polished; a motor which can change its number of revolutions; and a polishing table to which a polishing pad (polishing cloth) can be attached.

As the polishing pad, general nonwoven fabric, polyurethane, porous fluororesin and the like can be used with no particular limitation. The polishing pad is preferably provided with grooving, in which polishing liquid can be stored.

Polishing conditions are not also limited particularly, and it is preferable that, for example, rotational speed of the polishing table (platen) and a head (carrier) ranges from 10 rpm to 500 rpm independently, and pressure to be applied to the substrate having the object to be polished (polishing pressure) ranges from 0.5 psi to 10 psi. A method for supplying the polishing composition onto the polishing pad is not also limited particularly, and may be, for example, supplying the polishing composition continuously by a pump or the like. A supplying amount of the polishing composition is not also limited particularly, but it is preferable that a surface of the polishing pad is usually covered with the polishing composition of the present invention. Further, a polishing time is not also limited.

After completing the polishment, the substrate is washed in flowing water, and is dried by shaking off waterdrops that are attached to the substrate by a spin drier or the like, thereby obtaining the substrate containing oxygen atoms and silicon atoms.

The polishing composition of the present invention may be a one-component type or a multi-component type including a two-component type in which a part or a whole of the polishing composition is mixed at an arbitrary blend ratio. Further, if using a polishing device having plural supply paths for the polishing composition, two or more polishing compositions prepared in advance may be used so that the polishing compositions can be mixed on the polishing device.

Further, the polishing composition of the present invention may be undiluted solution, or may be prepared by diluting undiluted solution of a polishing composition with water. If the polishing composition is the two-component type, an order of mixing and diluting is arbitrary, and examples thereof include: diluting one of the compositions with water and then mixing the compositions together; diluting the compositions with water simultaneously with their mixing; and diluting the mixed polishing compositions with water.

[Method for Increasing Polishing Speed of Object to be Polished Containing Oxygen Atoms and Silicon Atoms and Reducing Generation of Scratches on Surface of Object to be Polished]

The present invention also provides a method for polishing the object to be polished containing oxygen atoms and silicon atoms with the polishing composition of the present invention, which can increase the polishing speed of the object to be polished and can reduce the generation of scratches on the surface of the object to be polished.

Since the above description applies in a similar manner to constituent elements of this method, description of such constituent elements will be omitted here.

EXAMPLES

The present invention will be described in more detail by showing following Examples and Comparative Examples. However, the technical scope of the present invention is not limited only to the following Examples. Incidentally, unless otherwise specified, "%" and "part" respectively mean "% by mass" and "part by mass". In addition, in the below examples, operations were carried out under conditions at a room temperature (25° C.) and relative humidity of 40% RH to 50% RH, unless otherwise specified.

Further, average silanol group density (unit: $nm^{-2}$) of abrasive grains A and abrasive grains B was calculated by the Sears method explained above.

Moreover, average primary particle sizes of the abrasive grains A and the abrasive grains B were measured by a dynamic light scattering particle size analyzer. Further, as an aspect ratio of the abrasive grains B, an average value of aspect ratios of 300 particle images, which are extracted at random from particle images obtained by the FE-SEM, was adopted. Incidentally, the average primary particle sizes of the abrasive grains A and the abrasive grains B and the aspect ratio of the abrasive grains B can also be calculated even if they are in a form of their mixture.

Example 1

As the abrasive grains, abrasive grains 1 were prepared. The abrasive grains 1 contained: 0.20% by mass of colloidal silica A1 having an average primary particle size of 6.2 nm and average silanol group density of 4.2 $nm^{-2}$ as the abrasive grains A, with respect to a mass of the total abrasive grains; and 99.80% by mass of colloidal silica B1 having an average primary particle size of 30 nm, average silanol group density of 1.5 $nm^{-2}$ and an aspect ratio of 1.5 as the abrasive grains B, with respect to the mass of the total abrasive grains. The average silanol group density of the abrasive grains 1 was 1.7 nm$^{-2}$. Incidentally, the contents of the abrasive grains A and the abrasive grains B can be obtained by: observing images of the sample at thirty points at random by the FE-SEM; subsequently counting the respective numbers of the abrasive grains A and the abrasive grains B in the images; and calculating averages of the respective counted numbers at the thirty points. The same applies hereafter. In addition, aspect ratios of the abrasive grains A used in Examples and Comparative Examples were all 1.8.

The above-described abrasive grains 1 were stirred and dispersed into a dispersing medium (pure water) so that total concentration of the abrasive grains A and the abrasive grains B in the composition might be 1% by mass, and nitric acid as a pH regulator was added so that a pH value of the polishing composition might be 3.0, thereby manufacturing the polishing composition (mixing temperature: about 25° C., mixing time: about 10 minutes). Incidentally, the pH value of the polishing composition (liquid temperature: 25° C.) was checked by a pH meter (model code: LAQUA, produced by HORIBA, Ltd.).

Examples 2 to 4

Polishing compositions were manufactured in a similar manner to Example 1 except for adopting abrasive grain concentration shown in Table 1.

Comparative Example 1

A polishing composition was manufactured in a similar manner to Example 1 except for using abrasive grains c1 instead of the abrasive grains 1 as the abrasive grains. The abrasive grains c1 did not contain the abrasive grain A, but contained 100% by mass of colloidal silica B2 having an average primary particle size of 31 nm, average silanol group density of 4.5 nm$^{-2}$ and an aspect ratio of 1.3 as the abrasive grains B, with respect to the mass of the total abrasive grains.

Comparative Example 2

A polishing composition was manufactured in a similar manner to Example 1 except for using abrasive grains c2 instead of the abrasive grains 1 as the abrasive grains and adjusting the abrasive grain concentration to be 10% by mass. The abrasive grains c2 did not contain the abrasive grain A, but contained 100% by mass of fumed silica B1 having an average primary particle size of 40 nm, average silanol group density of 1.2 nm$^{-2}$ and an aspect ratio of 3.1 as the abrasive grains B, with respect to the mass of the total abrasive grains.

Comparative Example 3

As the abrasive grains A, colloidal silica A2 having an average primary particle size of 6.2 nm and average silanol group density of 4.7 nm$^{-2}$ was prepared, and as the abrasive grains B, the above-described colloidal silica B2 was prepared. A polishing composition was manufactured in a similar manner to Example 1 except for using, instead of the abrasive grains 1, abrasive grains c3 which are obtained by stirring and dispersing the colloidal silica A2 and the colloidal silica B2 into a dispersing medium (pure water) so that a mass ratio of the colloidal silica A2/the colloidal silica B2 in the composition may be 0.01/99.99 and a total content of the colloidal silica A2 and the colloidal silica B2 may be 5% by mass. Average silanol group density of the abrasive grains c3 will be shown in Table 1.

Comparative Example 4

A Polishing composition was manufactured in a similar manner to Comparative Example 3 except for adopting a ratio between the abrasive grain A and the abrasive grain B shown in Table 1. Average silanol group density of abrasive grains c4 will be shown in Table 1.

Example 5

A polishing composition was manufactured in a similar manner to Comparative Example 3, except for using, instead of the colloidal silica B2, colloidal silica B3 having an average primary particle size of 33 nm, average silanol group density of 1.5 nm$^{-2}$ and an aspect ratio of 1.5 as the abrasive grains B. The average silanol group density will be shown in Table 1.

Examples 6 to 9

Respective polishing compositions were manufactured in a similar manner to Example 5 except for adopting a ratio between the abrasive grains A and the abrasive grains B as shown in Table 1. Average silanol group density thereof will be shown in Table 1.

Comparative Example 5

A polishing composition was manufactured in a similar manner to Comparative Example 3 except for using, instead of the abrasive grains c3, abrasive grains c5 which did not contain the abrasive grain A but contained 100% by mass of the colloidal silica B3 as the abrasive grains B with respect to the mass of the total abrasive grains. Average silanol group density thereof will be shown in Table 1.

Comparative Example 6

As the abrasive grains A, the colloidal silica A2 was prepared, and as the abrasive grains B, colloidal silica B4 having an average primary particle size of 35 nm, average silanol group density of 4.5 nm$^{-2}$ and an aspect ratio of 1.6 was prepared. A polishing composition was manufactured in a similar manner to Example 1 except for using, instead of the abrasive grains 1, abrasive grains c6 which are obtained by stirring and dispersing the colloidal silica A2 and the colloidal silica B4 into a dispersing medium (pure water) so that a mass ratio of the colloidal silica A2/the colloidal silica B4 may be 1/99 and a total content of the colloidal silica A2 and the colloidal silica B4 in the composition may be 5% by mass.

Comparative Example 7

A polishing composition was manufactured in a similar manner to Comparative Example 6 except for using, instead of the colloidal silica B4, colloidal silica B5 having an average primary particle size of 32 nm, average silanol group density of 1.5 nm$^{-2}$ and an aspect ratio of 1.3 as the abrasive grains B.

[Polishing Speed]

Polishing speed was measured by polishing an object to be polished (TEOS substrate) with the respective above-obtained polishing compositions under following polishing conditions.

(Polishing Conditions)

Polishing Device: Mirra-200 mm Polishing Machine (AMAT, produced by Applied Materials, Inc.)

Polishing Pad: Polyurethane Pad (IC1010, produced by Rohm and Haas Company)

Pressure: 1.8 psi

Conditioner (Dresser): Nylon Brush (A165, produced by 3M Company)

The Number of Rotations of Platen (Table): 93 rpm

The Number of Rotations of Head (Carrier): 87 rpm

Flow Rate of Polishing Composition: 200 ml/min

Polishing Time: 60 sec

The polishing speed (polishing rate) was evaluated by: obtaining film thicknesses of the object to be polished by an optical interference film thickness measurement system; and dividing a difference between the film thicknesses by the polishing time (see a below formula).

$$\text{Polishing Rate } [\text{Å/min}] = \frac{\text{Film Thickness before Polishment } [\text{Å}] - \text{Film Thickness after Polishment } [\text{Å}]}{\text{Polishing Time } [\text{min}]}$$

[Mathematical Formula 2]

The film thicknesses were obtained by the optical interference film thickness measurement system (model code: ASET, produced by KLA-Tencor Corporation), and the difference between the film thicknesses was divided by the polishing time for evaluation.

<Number of Scratches>

The number of scratches on a surface of the object to be polished was obtained by: scanning a whole surface of a wafer (excluding an area within 2 mm from its outer periphery) by a wafer surface inspection tool "Surfscan SP2" produced by KLA-Tencor Corporation; observing along all scanned coordinates by using a Review-SEM (RS-6000, produced by Hitachi High-Technologies Corporation); and summing the respective numbers of the scratches.

Evaluation results of the polishing compositions of Examples 1 to 9 and Comparative Examples 1 to 7 will be listed below in Table 1.

TABLE 1

| | Polishing Composition Number | Kind of Abrasive Grain | Abrasive Grain Concentration (% by mass) | Ratio (Total Abrasive Grain as 100% by mass) | | Average Silanol Group Density ($nm^{-2}$) | Aspect Ratio of Abrasive Grain B | TEOS Polishing Speed [Å/min] | The Number of Scratches |
|---|---|---|---|---|---|---|---|---|---|
| | | | | Abrasive Grain A (% by mass) | Abrasive Grain B (% by mass) | | | | |
| Example 1 | 1 | Abrasive Grain 1 | 1 | 0.20 | 99.80 | 1.7 | 1.5 | 1774 | 21 |
| Example 2 | 2 | Abrasive Grain 1 | 2 | 0.20 | 99.80 | 1.7 | 1.5 | 2129 | 23 |
| Example 3 | 3 | Abrasive Grain 1 | 3 | 0.20 | 99.80 | 1.7 | 1.5 | 2280 | 22 |
| Example 4 | 4 | Abrasive Grain 1 | 5 | 0.20 | 99.80 | 1.7 | 1.5 | 2333 | 24 |
| Comparative Example 1 | 5 | Abrasive Grain c1 | 1 | 0 | 100 | 4.5 | 1.3 | 26 | 765 |
| Comparative Example 2 | 6 | Abrasive Grain c2 | 10 | 0 | 100 | 1.2 | 3.1 | 1833 | 444 |
| Comparative Example 3 | 7 | Abrasive Grain c3 | 5 | 0.01 | 99.99 | 4.5 | 1.3 | 155 | 812 |
| Comparative Example 4 | 8 | Abrasive Grain c4 | 5 | 0.10 | 99.90 | 4.5 | 1.3 | 172 | 698 |
| Example 5 | 9 | Abrasive Grain 2 | 5 | 0.01 | 99.99 | 1.5 | 1.5 | 2398 | 23 |
| Example 6 | 10 | Abrasive Grain 3 | 5 | 0.10 | 99.90 | 1.5 | 1.5 | 2333 | 32 |
| Example 7 | 11 | Abrasive Grain 4 | 5 | 0.50 | 99.50 | 1.5 | 1.5 | 2208 | 28 |
| Example 8 | 12 | Abrasive Grain 5 | 5 | 1.00 | 99.00 | 1.5 | 1.5 | 1999 | 22 |
| Example 9 | 13 | Abrasive Grain 6 | 5 | 10.00 | 90.00 | 1.5 | 1.5 | 765 | 32 |
| Comparative Example 5 | 14 | Abrasive Grain c5 | 5 | 0 | 100 | 1.5 | 1.5 | 301 | 557 |
| Comparative Example 6 | 15 | Abrasive Grain c6 | 5 | 1.00 | 99.00 | 4.5 | 1.6 | 572 | 38 |
| Comparative Example 7 | 16 | Abrasive Grain c7 | 5 | 1.00 | 99.00 | 1.5 | 1.3 | 214 | 438 |

From above Table 1, it was found that the polishing compositions of Examples can increase the polishing speed of the TEOS substrate more, and can reduce the number of scratches generated on the surface of the TEOS substrate more than those of the polishing compositions of Comparative Examples. Further, from Comparative Examples 5 to 7, it was found that, unless satisfying any of: the required condition of the relation between the contents of the abrasive grains A and abrasive grains B; the required condition of the average silanol group density of the abrasive grains A and abrasive grains B; and the required condition of the aspect ratio of the abrasive grains B, the effects for increasing the polishing speed of the TEOS substrate and reducing the number of scratches generated on the surface of the TEOS substrate cannot be obtained.

The present application is based on the Japanese patent application No. 2015-192425 filed on Sep. 30, 2015, and a disclosed content thereof is incorporated herein as a whole by reference.

The invention claimed is:

1. A polishing composition used for polishing an object to be polished containing oxygen atoms and silicon atoms, the polishing composition comprising: abrasive grains A having an average primary particle size of 3 nm or more and 8 nm or less; abrasive grains B having an average primary particle size of more than 8 nm; and a dispersing medium, wherein a content of the abrasive grains B in the polishing composition is larger than a content of the abrasive grains A in the polishing composition, average silanol group density of the abrasive grains A and the abrasive grains B is 2.0 nm-2 or less, and an aspect ratio of the abrasive grains B is more than 1.3 and 2.0 or less.

2. The polishing composition according to claim 1, having a pH value of 2.0 or more and 6.0 or less.

3. The polishing composition according to claim 1, wherein the object to be polished contains tetraethylorthosilicate.

4. The polishing composition according to claim 1, wherein a mass ratio between the abrasive grains A and the abrasive grains B (the abrasive grains A/the abrasive grains B) ranges from 0.01/99.99 to 20/80.

5. The polishing composition according 4, wherein the mass ratio between the abrasive grains A and the abrasive grains B (the abrasive grains A/the abrasive grains B) ranges from 0.01/99.99 to 8/92.

6. The polishing composition according to claim 1, wherein a content of the abrasive grains A and the abrasive grains B in the polishing composition (abrasive grain concentration) is 2% by mass or more.

7. A polishing method for polishing an object to be polished containing oxygen atoms and silicon atoms with the polishing composition according to claim 1.

* * * * *